United States Patent [19]

Linsker

[11] Patent Number: 4,782,193

[45] Date of Patent: Nov. 1, 1988

[54] POLYGONAL WIRING FOR IMPROVED PACKAGE PERFORMANCE

[75] Inventor: Ralph Linsker, Millwood, N.Y.

[73] Assignee: IBM Corp., Armonk, N.Y.

[21] Appl. No.: 101,228

[22] Filed: Sep. 25, 1987

[51] Int. Cl.⁴ .............................................. H05K 1/00
[52] U.S. Cl. .................................. 174/68.5; 361/410; 361/414; 361/416
[58] Field of Search ................ 174/68.5; 361/409, 410, 361/414, 416

[56] References Cited

U.S. PATENT DOCUMENTS

| | | | |
|---|---|---|---|
| 3,179,913 | 4/1965 | Mittler et al. | 339/18 |
| 3,470,612 | 10/1969 | Helms | 29/593 |
| 4,254,445 | 3/1981 | Ho | 361/392 |
| 4,298,770 | 11/1981 | Nishihara et al. | 174/68.5 |
| 4,302,625 | 11/1981 | Hetherington et al. | 174/68.5 |
| 4,535,388 | 8/1985 | Kraus et al. | 361/414 |
| 4,620,264 | 10/1986 | Ushifusa et al. | 174/68.5 X |

OTHER PUBLICATIONS

Jarvela, R. A. et al.; Wirability Enhancement; IBM Technical Disclosure Bulletin; vol. 21, No. 9; Feb. 1979; p. 3624.
Blodgett, Jr., "Microelectronic Packaging", Scientific American, 1983, pp. 86-96.
Ecker et al., "Semiconductor Package Structure", IBM TDB, vol. 20, No. 8, Jan. 1978, pp. 3092-3093.
Layden, "Use of Relatively Diagonal and Rectangular Wiring Planes in Multilayer Packages", IBM TDB, vol. 14, No. 4, Sep. 1971, pp. 1316-1317.
Linsker, "An Iterative-Improvement Penalty-Function-Driven Wire Routing System", IBM J. Res. Develop., vol. 28, No. 5, Sep. 1984, pp. 613-624.

Primary Examiner—Morris H. Nimmo
Attorney, Agent, or Firm—Pollock, Vande Sande & Priddy

[57] ABSTRACT

A connection arrangement includes a plurality of sets of wiring planes, wherein any connection uses one and only one set of the planes. Each plane is a principal wiring direction. Various economies are affected by arranging the relationship between pairs of wiring planes in a set to have principal wiring directions lying at an acute angle. In one preferred embodiment each set includes a pair of planes and the acute angle between principal wiring directions is 45°.

14 Claims, 5 Drawing Sheets

POLYGONAL WIRING FOR IMPROVED PACKAGE PERFORMANCE

FIELD OF THE INVENTION

The invention generally relates to an interconnection arrangement for semiconductor chip modules.

DESCRIPTION OF THE PRIOR ART

Various techniques have been employed for routing connecting wires for chips mounted on ceramic or other substrates. The term wire or wires includes a conductor and comprehends printed conductors. This literature reveals that connection wiring is implemented using several "planes" with a majority of the wiring on a "plane" running in a single direction. The wiring direction of the majority of wiring on a "plane" will be referred to as the principal wiring direction or the principal wiring direction of the "plane". Several "planes" are used to provide wiring running at a variety of directions. To make a connection in an arbitrary direction at least two different principal wiring directions are needed. Using more than two principal wiring directions has the advantage of generally reducing the connection length for connections in arbitrary directions. That reduction is an important goal since it impacts on the resistive losses due to connections, it impacts on total propagation delay, and it impacts on the total number of wiring planes necessary for connection.

In the foregoing the term "plane" refers to a unitary wiring component or substrate which supports wiring which has the property that any given wiring path is prohibited from crossing any other wiring path on the component. While the majority of such components are planar or have a planar characteristic there is no requirement that the component actually has this planar characteristic. That is the term that has been used (and will be used throughout this description and in the appended claims) to refer to such a component which may not have a planar characteristic because it is warped, deformed rounded, bent, etc.

In one wiring arrangement the directions used are rectangularly related, i.e. all wiring directions are either parallel to any given wiring direction or perpendicular thereto. The prior art has added to this complement an additional direction which is oblique (for example 45°) to the previously mentioned directions. Nishihara, in U.S. Pat. No. 4,298,770, suggests an oblique wiring direction which is not at a 45° angle with the rectangularly related wiring directions.

In some technologies the number of different wiring planes which may be used for a single connection is limited to a small number of planes, sometimes as small as two or three. This does not limit the number of wiring directions to that number of wiring directions since sets of wiring planes can be used, where a single connection uses only the planes in a set but there are plural sets of wiring planes whose wiring directions are different. Note that Nishihara does not address this issue since in the arrangement diclosed any wiring plane may connect with any other wiring plane. To implement this technique, however, two selections must be made. First the wiring directions to use must be selected and second which of the selected wiring directions to provide in the different sets of wiring planes must be selected.

In the foregoing, and in the remainder of this description (and the appended claims) the term set refers to a number or group of wiring directions associated with the planes within which any single connection is completed. It should also be understood that the number of wiring directions associated with the planes in any set is less than the total number of different wiring directions (otherwise the "selection" is trivial).

The publications by Ecker and Layden (cited below) do address this issue. These publications disclose using two sets of wiring planes with two planes per set. In both sets the wiring directions are orthogonal to each other. In a first set each wiring direction of the set lies along one of the Cartesian axes. In the second set each of the .iwring directions lies at a 45° angle to the Cartesian axes.

A variety of techniques are described in Mittler U.S. Pat. No. 3,179,913; Helms U.S. Pat. No. 3,470,612; Ho U.S. Pat. No. 4,254,445; Nishihara U.S. Pat. No. 4,298,770 and Kraus et al U.S. Pat. No. 4,535,388. More generalized discussion is found in Blodgett, Jr., "Microelectronic Packaging" in *Scientific American* (1983), at pp. 86 et seq. Other examples of wiring arrangements are found in Linsker, "An Iterative Improvement Penalty-Function-Driven Wire Routing System" in the *IBM Journal of Research and Development*, Vol. 28, No. 5 (September 1984), at pp. 613 et seq. Layden, "Use of Relatively Diagonal and Rectangular Wiring Planes in Multilayer Packages" appearing in the IBM Technical Disclosure Bulletin, Vol. 14, No. 4 September 1971 at pages 1316–1317 and Ecker et al, "Semiconductor Package Structure" appearing in IBM Technical Disclosure Bulletin, Vol. 20, No. 8 January 1978 at pages 3092–3093.

It is therefore an object of the invention to reduce, optimize or minimize wiring length using a set or sets of wiring planes having standardized principal wiring directions. It is another object of the invention to provide for the reduction, optimization or minimization in wiring length which is applicable in those technologies limiting each interconnection to lie within a single wiring plane set or pair, where the principal wiring directions of the set or pair do not comprise all principal wiring directions.

SUMMARY OF THE INVENTION

The invention meets these and other objects by providing a wiring arrangement for connecting a plurality of electrical or electronic devices which are supported adjacent the wiring arrangement. The wiring arrangement includes a plurality of sets of wiring planes, each of the wiring planes in the sets referred to supporting conductive wiring oriented in a principal wiring direction and further supporting a plurality of connection sites arranged at intersections of theoretical orthogonal lines. In accordance with the invention, each connection is implemented solely within a single set of planes. There are means connecting selected terminals of selected devices with selected ones of the connection points on the wiring planes. Each of the referred to sets of wiring planes includes at least first and second wiring planes, e.g. at least a pair of wiring planes. A principal direction of wiring on a first wiring plane of a set lies at an acute angle to a principal direction of wiring on a second wiring plane of said set. In one embodiment, the principal direction of wiring on all of the first wiring planes is either orthogonal or parallel to the principal wiring direction of all other first wiring planes. A principal direction of wiring on the second wiring planes is either orthogonal or parallel to the principal wiring direction of all other second wiring planes.

The minimum number of wiring planes in accordance with one embodiment of the invention includes four wiring plane pairs; in this embodiment the acute angle is about 45°. Thus a first wiring plane pair includes a first plane with the principal wiring direction at 0° (for example, in the direction of the abscissa in a Cartesian coordinate system) and the second plane of the pair has a principal wiring direction at an angle of about 45° (with reference to the same set of axes). The second pair has principal wiring directions of 90° and 45°, the third set of the pair has principal wiring directions of 90° and 135° and the fourth set of the pair has principal directions at 180° (or 0°) and 135°.

For the first wiring planes of each pair, with principal wiring directions in the X (or 0°) and Y (90°) directions, the wiring can be laid in between the connection sites. On the other hand, for the second wiring planes whose principal wiring directions are diagonal or oblique to the sides of the module, the actual wiring may have to depart from the principal wiring direction to meander around connection sites. Thus in defining the principal wiring direction, meander of the wiring around connection sites is not considered. Furthermore, depending upon wire width, and the spacing between connection sites, the meander around the connection sites may lie perpendicular to the theoretical orthogonal lines at whose intersections the connection sites lie. If the grid spacing (of connection sites) is relaxed (increased), then this extreme departure of the meander from the principal wiring direction can be relaxed.

In another embodiment of the invention, the wiring arrangement includes, as a minimum, three wiring plane pairs, and the principal wiring directions differ from the embodiment described above. In this specific embodiment of the invention, a first wiring plane pair includes principal wiring directions at 0° and 60°, a second wiring plane pair includes principal wiring directions of 60° and 120°, and a third wiring plane pair includes principal wiring directions at 120° and 180° (which is the same as 0°).

More generally, the wiring arrangement in accordance with a preferred group of embodiments of the invention includes n+1 plane pairs, where n is an integer greater than unity, and the principal wiring directions can be expressed as 0°, z°; z°, 2z°; 2z°, 3z°; ... nz°, 180°, where z is (180/n+1). It will be appreciated that in this arrangement the principal wiring directions for the planes in each pair form an acute angle relative to each other. Furthermore, each wiring plane in any set has a principal wiring direction which is identical to the principal wiring direction of at least one other wiring plane in a different and non-identical set.

Typically the wiring arrangement includes, in addition to the various wiring planes, a plurality of reference planes which are interposed between different sets or pairs of wiring planes. The reference planes carry partially conductive surfaces to shield wiring planes from cross-talk with other wiring planes in different sets or pairs.

It should be apparent from the foregoing that the invention can be applied to satisfy the interconnection wiring in a variety of different technologies beyond the multi-layer ceramic technology specifically referenced above. For example, each of the wiring planes may exist on a different printed circuit board, or the wiring planes can lie at different levels of a multilayer board.

While the minimum number of plane pairs in accordance with various embodiments has been specified, it should be apparent that in some cases there may be more wiring plane pairs than the minimum to accommodate the interconnection wiring required. Furthermore, there may be wiring planes, plane pairs or sets of planes in the connection arrangement which do not exhibit the relationship of principal wiring directions already specified.

It is also apparent that inasmuch as wiring or a conductive path is bidirectional, a principal wiring direction of 0° is identical to a principal wiring direction of 180°; likewise 90° and 270° wiring directions are identical; as are 135° and 315°, and 45° and 225° and others. Finally, although various wiring planes are characterized by wiring running in a principal wiring direction, this should not be taken as an indication that 100% of the wiring in a plane lies in the principal wiring direction. Rather, the principal wiring direction is established by the direction of the majority of the wiring in a particular plane.

In accordance with another aspect of the invention, the wiring arrangement includes a plurality of wiring plane pairs, each of which has wiring run in a principal wiring direction. Each of the pairs includes first and second wiring planes. A first wiring plane in any pair has a principal wiring direction which is either parallel or orthogonal to the principal wiring direction of every other first plane of a pair of wiring planes. A second wiring plane of any pair has a principal wiring direction which is either parallel or orthogonal to the principal wiring direction of every other second wiring plane. The principal wiring direction of first planes may be parallel to a side of the module whereas the principal wiring direction of second wiring planes is diagonal or oblique with respect to an edge of the module. As a consequence of the foregoing arrangement, each pair of wiring planes has principal wiring directions which differ by an angle less than 90°.

In accordance with another aspect of the invention, there are a plurality of sets of wiring planes including at least first and second wiring planes in each set. A principal direction of wiring on a first wiring plane in a set lies at an acute angle to a principal direction of wiring on a second wiring plane of the same set. A principal wiring direction on each wiring plane in each set is identical to a principal wiring direction of at least one wiring plane of another, non-identical set. There may be for example n+1 sets of wiring planes, where n is an integer greater than unity and each set includes a pair of planes. The principal wiring directions for the wiring plane pairs, expressed relative to the abscissa of a Cartesian coordinate system can be represented as 0°, z°; z°, 2z°; 2z°, 3z°; ... nz°, 180°, where z is given as (180/n+1).

Another group of embodiments uses sets of at least three planes per set, where there are more principal wiring directions than planes in a set although each connection is still made within the planes of a single set. Accordingly the selection problem is still present in this group of embodiments since no set presents all principal wiring directions.

BRIEF DESCRIPTION OF THE DRAWINGS

The invention will now be further described in the following portions of the specification when taken in conjunction with the attached drawings in which like reference characters identify identical apparatus and in which.

DETAILED DESCRIPTION OF A PREFERRED EMBODIMENT

The wiring arrangement of the present invention employs a plurality of sets of wiring planes; FIGS. 1-4 illustrate plan views of four different wiring planes in accordance with the present invention. All the wiring planes employed in the present invention have three important components, a substrate, a plurality of conductors supported on the substrate and a plurality of connection sites C. Each of the wiring planes has connection sites C located at the intersection of theoretical orthogonal lines, which theoretical orthogonal lines are parallel to sides of the module; these theoretical lines are shown dashed in FIG. 1 and two of them are identified as 01 and 02, respectively. The connection site C forms locations for either a Logic Service Terminal (or LST) or a via. An LST provides a connection site to a conductor to/from an off-board point, e.g. an I/O conductor relative to the package. A via, on the other hand, provides a connection site for an intrapackage connection. Any one of the connection sites C is potentially available for connection to an adjacent conductor. While FIGS. 1-4 shows a connection site C at each intersection, in general not all intersections are available as connection sites. Furthermore, conductive components such as pins can be used to complete a conductive path from a conductor through a connection site C to a terminal of an electrical or electronic device which is located off the wiring plane. The connection sites C also provide a location for a programmable via to connect an adjacent conductor plane through a conductive component to components in a different wiring plane such as another connection site C and one of its adjacent conductors. Thus the single interconnection may use none, one or more programmable vias. The optimization of interconnection or reduction of interconnection length is effected by selectively associating different sets of wiring planes whose principal wiring directions are different, as will be more clearly described hereinafter.

Figure 1:
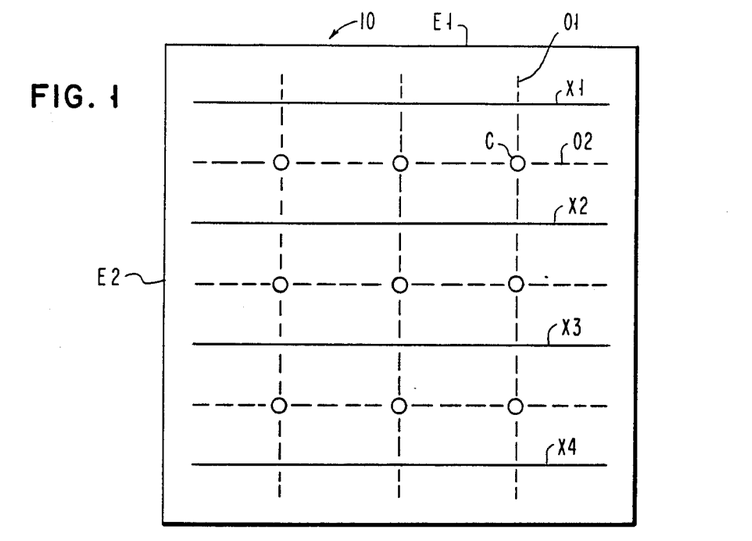
FIGS. 1-4 schematically illustrate four different wiring planes employed in accordance with the invention.

The particular wiring plane shown in FIG. 1, that is wiring plane 10, includes substantially orthogonal edges E1 and E2. As shown in FIG. 1, the principal wiring direction is in the X (or −X) direction in a typical Cartesian coordinate system. This principal wiring direction is parallel to the edge E1 and perpendicular to the edge E2. The lines X1-X4 represent wiring tracks in the principal wiring direction for plane 10. A printed conductor may be laid in some or all of the wiring tracks X1-X4, as necessary. In the plane 10 illustrated in FIG. 1, there is a single wiring track between connection sites. Those skilled in the art are aware that depending on various size parameters, there may be multiple wiring tracks between connection sites.

Figure 2:
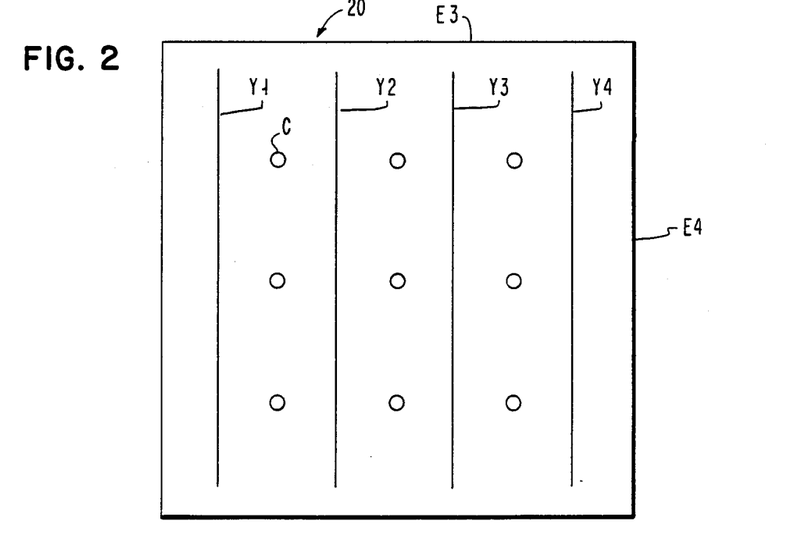
Figure 3:
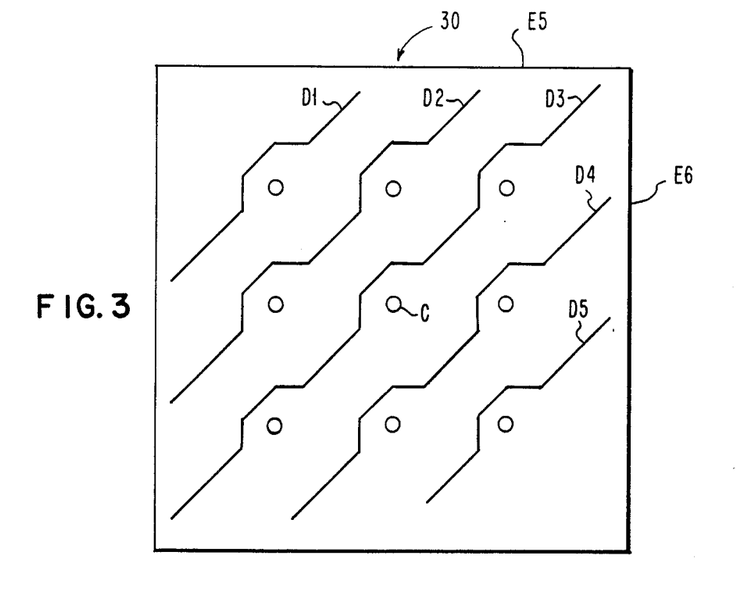
Figure 4:
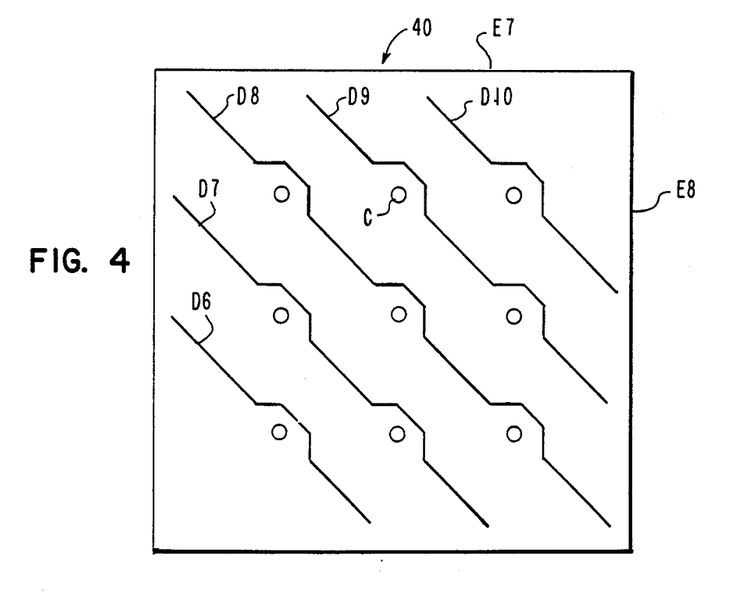

The wiring plane 20 shown in FIG. 2 has edges E3 and E4. The principal wiring direction for the plane 20 is substantially parallel to the edge E4 and perpendicular to the edge E3. The lines Y1-Y4 in FIG. 2 represent wiring tracks for the plane 20 which illustrate the principal wiring direction for plane 20. The principal wiring directions for the planes shown in FIGS. 1 and 2 are parallel to the Cartesian coordinate system axes. On the other hand, the principal wiring direction or the direction of the conductors in the planes of FIGS. 3 and 4 is oblique to the Cartesian coordinate system axes. More particularly, the principal wiring direction in FIG. 3 is oblique to both the edges E5 and E6, whereas the principal wiring direction in the wiring plane shown in FIG. 4 is also oblique to the edges E7 and E8. In FIGS. 3 and 4 lines D1-D10 also represent wiring tracks for planes 30 and 40. In one particular embodiment of the invention, the principal wiring direction for the plane 30 forms an angle of about 45° with either of the axes of the Cartesian coordinate system, as does the principal wiring direction for the plane 40. The principal wiring direction of plane 30 will be referred to as 45° whereas the principal wiring direction of plane 40 will be referred to as 135°. Whereas the wiring tracks in the planes 10 and 20 consist of straight parallel lines, the wiring tracks in planes 30 and 40 include portions which consist of straight parallel lines and other portions which meander to divert the conductor's path so it does not intersect with any of the connection sites C on the wiring plane.

Figure 5:
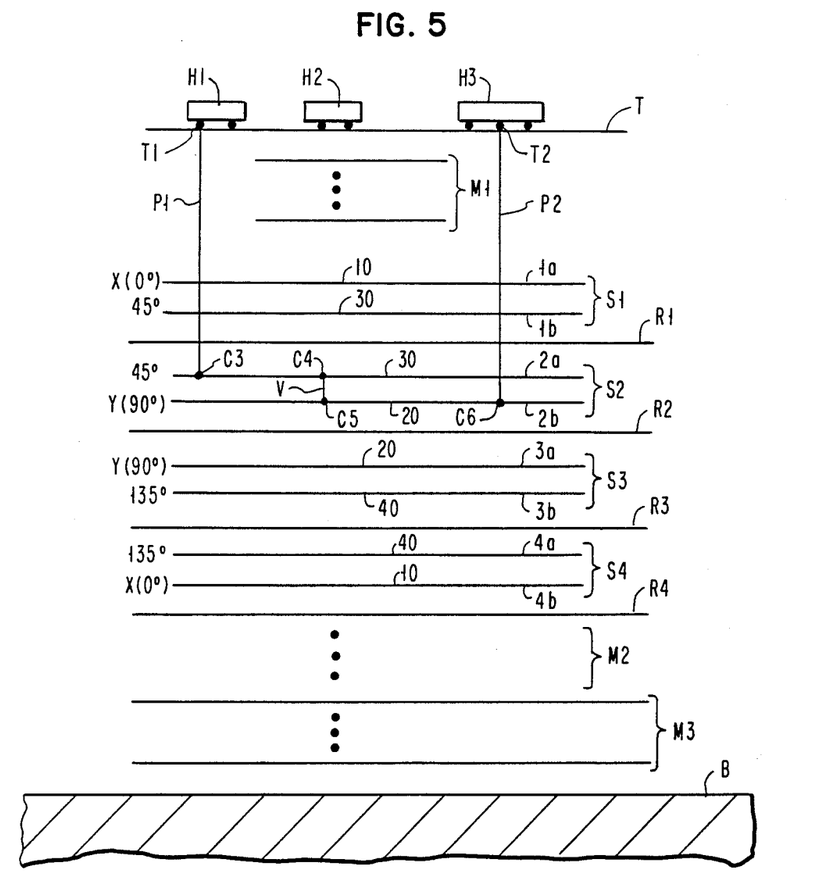
FIGS. 5 and 6 are cross-sections of modules having wiring planes in accordance with the present invention.

FIG. 5 is a cross-section of a module which includes a wiring arrangement in accordance with the present invention. FIG. 5 schematically shows that the module includes a top element or plane T which supports one or more electrical or electronic devices. These are schematically represented at H1, H2 and H3. Each of these electrical or electronic devices H1-H3, which may comprise for example semiconductor chips, are conductively connected to a wiring pattern which may be supported on the plane or layer T. The wiring arrangement of the present invention is arranged to provide for connecting terminals of the various electrical or electronic devices, such as terminals T1 and T2. More particularly, the wiring arrangement includes a plurality of sets of wiring planes including for example sets S1, S2, S3 and S4. As shown in FIG. 5, each of the sets comprises a pair of wiring planes. For example, the set S1 includes wiring planes 1a and 1b which comprise the wiring planes 10 and 30, respectively. Set S2, including planes 2a and 2b, may for example comprise the planes 30 and 20, respectively. Set S3 includes planes 20 and 40 while set S4 includes planes 40 and 10. The planes 10-40 as used in FIG. 5 differ from those shown in FIGS. 1-4 in that some of the conductor tracks X1-X4, Y1-Y4 and D1-D10 have had printed circuit wiring or conductive patterns laid therein along with conductive connection between selected conductive patterns and selected connection sites C. Each of the sets of wiring planes may be separated from an adjacent set by a reference plane such as reference planes R1-R4. The reference planes are provided, as is relatively conventional in the art, for preventing electrical cross-talk between wiring planes in different sets. The reference planes include three major components, a substrate, a plurality of vias or holes allowing conductive paths to pass therethrough, and a conductive pattern supported on the substrate but insulated from the vias.

The cross-section of FIG. 5 is intended to represent the wiring arrangement including the sets of wiring planes S1-S4 and its relationship to the top plane T. A typical module will include, in addition to the foregoing structure, a plurality of signal-redistribution and power planes (and possibly an additional reference plane R0)

represented as the group of planes M1. Furthermore, a typical module may include power distribution planes represented as the set of planes M3. In addition, in the unillustrated planes identified in the region M2, other plane pairs or a duplication of one or more of the sets S1-S4 may be provided. The module finally includes a bottom surface B which may provide connectors to a next level package, mother board or the like.

A typical interconnection of the terminals T1 and T2 is shown in FIG. 5. More particularly, the terminal T1 is connected to a conductive element or pin P1, at one end of the pin P1. The other end of the pin P1 is connected to a particular connection site C3 of the wiring plane 2a. Holes in planes between planes T and 2a allow the pin P1 to remain insulated from intervening components. Although not shown in FIG. 5, the connection site C3 is connected to a particular conductor on the wiring plane 2a. Another point on the same particular conductor is connected to a different connection site C4. The connection site C4 is connected to one end of a programmable via V or a short pin V. The same via V is connected to a connection site C5 on the plane 2b. The connection site C5 is connected to a particular conductor on the plane 2b, and another point on the same particular conductor is connected to connection site C6. The connection site C6 is connected to a further conductive element or a pin P2 at one end. The other end of the pin P2 is connected to the terminal T2.

Figure 6:
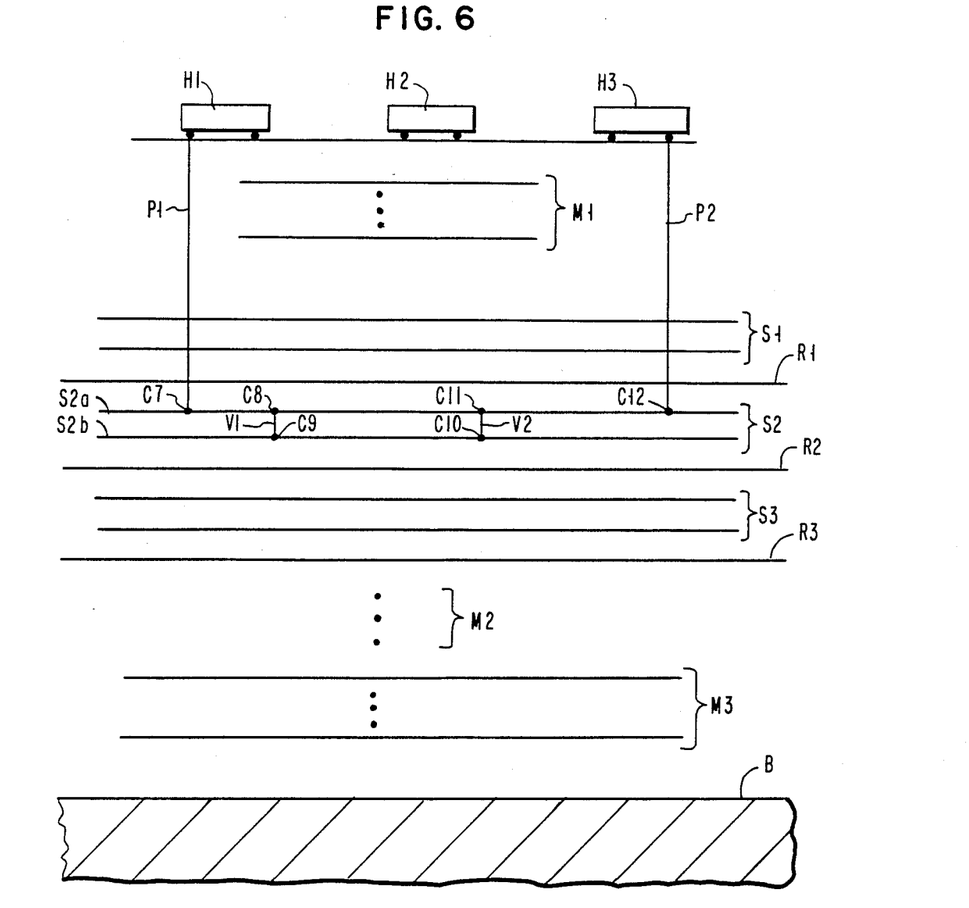

FIG. 6 is another cross-section, similar to FIG. 5, but showing a different use of the sets of planes for connecting terminals of electrical or electronic devices in accordance with the present invention. The particular connection illustrated in FIG. 5, in cross-section, used a single via and thus one terminal of one electrical or electronic device was connected to a first wiring plane 2a and a terminal of a second electrical or electronic device was connected to a different plane 2b, of the same pair. The particular connection shown in FIG. 6 uses vias V1 and V2 so that the two different terminals of the electrical or electronic devices being interconnected are respectively connected to the same wiring plane. More particularly, and as shown in FIG. 6, the pin P1 connects a terminal of the electronic or electrical device H1 to a connection site C7 on the plane S2a. A conductor on the plane S2a is connected between the connection sites C7 and C8. A via V1 connects the connection site C8 to a connection site C9 on a plane S2b. Connection site C9 is connected by a conductor on the plane S2b to a connection site C10. A via V2 is connected between the connection site C10 and a connection site C11 on the plane S2a. Another conductor on the plane S2a is connected between the connection sites C11 and C12. Finally, the pin P2 is connected between a terminal of the electronic or electrical device H3 and a connection site C12.

From considering FIGS. 1-6 it should be apparent that the wiring arrangement described herein provides for connecting a plurality of electrical or electronic devices, e.g. the devices H1 and H3 which are supported on the top surface of common plane T. The wiring arrangement includes plural sets (S1-S4 in FIG. 5) of wiring planes, each of the wiring planes supports conductive wiring oriented in a principal wiring direction and further supports a plurality of connection sites C arranged at intersections of theoretical orthogonal lines.

The pins such as P1 and P2 interconnect selected devices with selected ones of the connection points on the same or different ones of the wiring plaes. Every connection uses planes within one and only one set of planes.

Each of the sets of wiring planes includes at least first and second wiring planes. The reader can verify that in each of the sets shown in FIG. 5, a principal direction of wiring in a first wiring plane lies at an acute angle to a prinipal direction of wiring on the second wiring plane. Furthermore, considering the wiring planes 1a, 2b, 3a and 4b as first wiring planes, it will be realized that the wiring directions on all of these planes are orthogonal or parallel to each other. Similarly, considering the planes 1b, 2a, 3b and 4a as second wiring planes, the reader can verify that the principal direction of wiring of these planes is either parallel or orthogonal to each other.

In a like fashion, the principal direction of wiring on the planes 1a, 2b, 3a and 4b are parallel or orthogonal to one of the edges of the module. On the other hand, the principal wiring direction of the planes 1b, 2a, 3b and 4a form an acute angle, are oblique or diagonal, with or to at least one of the edges of the module.

It should be understood that the invention is not limited to sets of wiring planes fashioned from pairs of planes selected from the planes 10-40 (of FIGS. 1-4). More particularly, in the embodiment of FIGS. 1-4 the acute angle between the principal wiring directions of a pair of planes in set is 45°; other different acute angles could also be employed, e.g. 30°, 60°, etc. In the embodiment shown in FIG. 5, one plane of each pair has a principal wiring direction which is either parallel to or orthogonal to a principal wiring direction of one of the planes in each other set. Likewise, this is not an essential characteristic of the invention. For example, in another embodiment of the invention, I provide a set of wiring planes with principal wiring directions at angles of 0°, 60° and 120° to the abscissa in a Cartesian coordinate system (which is parallel to one of the edges of the wiring plane). In this embodiment of the invention, a first plane pair has principal wiring directions of 0° and 60°, a second pair has principal wiring directions of 60° and 120°, and a third plane pair has principal wiring directions of 120° and 0° (or 180° which is identical to 0°).

In a more general construction of a wiring arrangement where there are n+1 wiring plane pairs, the principal wiring directions in each plane pair are 0°, z° (for a first pair), z°, 2z° (for a second pair), 2z°, 3z° (for a third pair), and repeating in this fashion until nz°, 180° (or 0°) for the last plane pair, where z is the quantity (180/n+1). If n is an integer greater than one, then each pair of planes has principal wiring directions which make an angle of z° with each other, and z° is an acute angle. Considering the wiring directions of any pair, there is at least one non-identical pair which has a common wiring direction with one of the planes of the pair.

We can tabulate representative wiring directions in plane pairs as a function of the minimum number of sets as follows when n=2 to 4:

|  | Set 1 | Set 2 | Set 3 | Set 4 | Set 5 |
| --- | --- | --- | --- | --- | --- |
| n = 2 | 0°,60° | 60°,120° | 120°,180° | — | — |
| n = 3 | 0°,45° | 45°,90° | 90°,135° | 135°,180° | — |
| n = 4 | 0°,36° | 36°,72° | 72°,108° | 108°,144° | 144°,180° |

While these three cases (n=2, 3, 4) are tabulated, it should be understood that the invention is also applicable where n>4.

As another example consider use of two sets of wiring planes with three planes per set. A first set used principal wiring directions of 0°, 45° and 90° and a second set uses planes at 90°, 135° and 180°.

As will now be described, the invention provides for a reduction (by about 10% or more) in interconnection wiring and approximately 17%–30% reduction in the number of wiring planes required. These advantages are obtained without any necessary reduction in via density and comply with the restriction in some technologies of employing a programmable via only within a plane pair (as is the case in multilayer ceramic module design) or within a set of planes. As is evident from the example shown in FIGS. 1-4, only a single line or conductor is provided for a single wiring channel (between adjacent connection sites C) although that is not a requirement, and multiple conductors or lines may be provided between adjacent connection sites if the spacing between connection sites, the width of the conductive lines and the spacing between conductive lines allows. The collection of wiring planes employed (of FIGS. 1-5) use principal wiring directions which are referenced as X (0°), 45°, Y (90°) and 135°, respectively, with reference to a Cartesian coordinate system. The oblique planes (with principal wiring directions at 45° and 135° respectively) include jogs or meanders to clear connection sites C. The wiring arrangement includes at a minimum four pairs of wiring planes oriented as, in a first pair, X (0°) and 45°, a second pair at 45°, Y (90°), a third pair at Y (90°), 135°, and a fourth pair at 135°, X (0°). The minimum set can of course be repeated to provide the necessary wiring capacity. A two pin connection between different electrical or electronic devices is assigned to one of the plane pairs whose two preferred axes (or principal wiring directions) lie closest to the orientation of the connection between the terminals drawn as a straight line.

Figure 7:
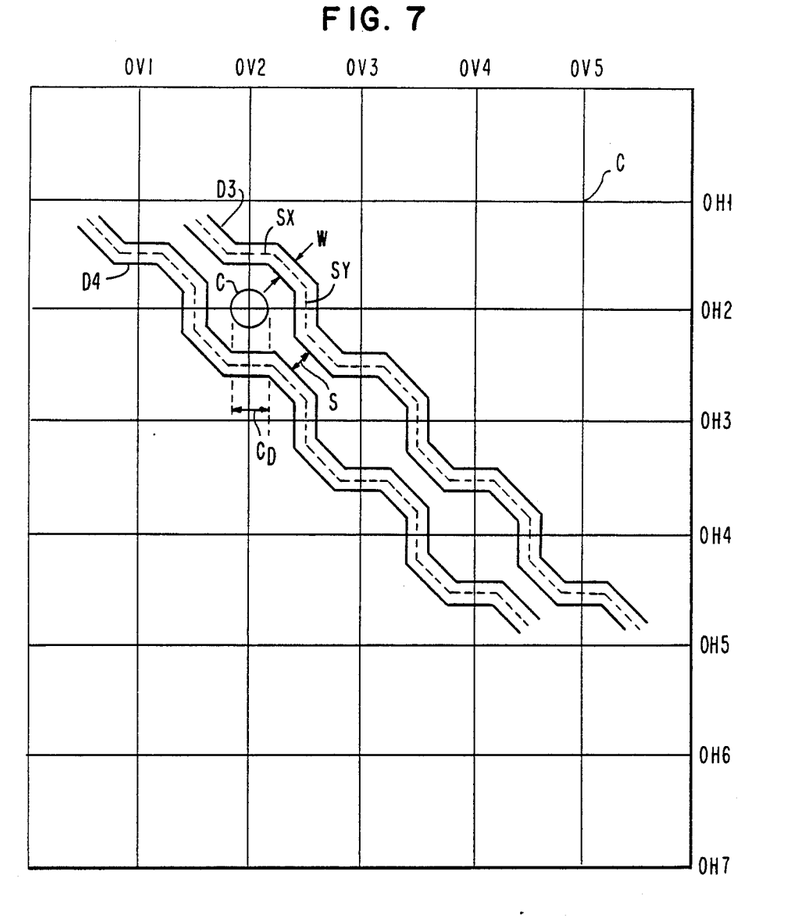
FIG. 7 illustrates a portion of the wiring plane such as shown in FIG. 3, illustrating in more detail the meander around connection sites.

FIG. 7 shows two of the conductors D3 and D4 typical of one of the two oblique planes 30 and 40. FIG. 7 is drawn for a "worst case" situation in which the wire width W, required clearance from connection sites, and grid spacing (between adjacent connection sites) are such that the conductive pattern cannot run obliquely between adjacent connection sites C. In other words, the connection site diameter $C_D$, plus the wire width W, plus twice the required connection site clearance is equal to the distance between adjacent connection sites C. This is the minimum condition needed for the usual orthogonal wiring with one line per wiring channel. (A channel is the region between adjacent connection sites C.) If the grid spacing is larger than this minimum then the inclination of the X running segment SX and the Y running segment SY can be altered to run closer to the 45° axis which results in additional wire length savings as will be described below.

In order to describe the wire length savings, consider a set of connections which is isotropic, e.g. all orientation directions are equally represented in the set of connections to be implemented. There are a number of different connection possibilities including Euclidean or straight line length (referred to as EUCL), a minimum-Manhattan length e.g. along orthogonal axes in a Cartesian coordinate system (represented as MANH), the minimum connection length for the shortest route lying along the principal wiring directions used in accordance with the present invention, but ignoring the additional length required for jogs or meander (represented as L45) and the actual connection length for the same route including jogs or meanders (represented as L45J). Calculating the connection length ratios under these four different cases for completely isotropic connections, the result is the following:

$$MANH/EUCL = 1.273 \qquad (1)$$

$$L45/EUCL = 1.055 \qquad (2)$$

$$L45J/EUCL = 1.145 \qquad (3)$$

$$L45/MANH = 0.829 \qquad (4)$$

$$L45J/MANH = 0.900 \qquad (5)$$

In other words for making isotropic connections, restriction to a minimum Manhattan connection requires 27.3% more connecting wiring than in the Euclidean (straight line) case. Under the L45 regime (that is, in accordance with the present invention but ignoring the additional length required by meanders and jogs), 5.5% additional wiring is required as compared to the Euclidean case. When we measure the additional wiring required by meanders or jogs, we find that the invention requires 14.5% more connecting wiring than the Euclidean case. It should be apparent to those skilled in the art that while the Euclidean case is minimum connecting wiring, it is wholly impractical, for printed-circuit interconnections. More revealing comparisons are provided by the next two ratios. The next ratio (L45/MANH) indicates that employing the present invention reduces the required wiring by about 17% compared to the minimum Manhattan length (ignoring the length required for meanders and jogs). The last ratio (L45J/MANH) indicates that even if we include the additional wiring length caused by the need for meanders or jogs, we are still 10% below the minimum Manhattan length.

Note the 10% reduction below Manhattan length (L45J/MANH=0.9) even for the worst case considered above.

As an alternative mentioned in the prior art (see Ecker), we can consider plane pairs whose axes are orthogonal to each other within each plane pair, e.g. X-Y in one pair and 45°-135° in another plane pair. We will refer to the regime as MANH1. In this regime we ignore the lengths of jogs or meanders as we did in L45. We will refer to lengths MANH1J where we include the lengths of jogs or meanders. For this case we obtain MANH1/MANH=0.918 and MANH1J/MANH=0.975. Thus the invention increases the length savings four-fold from 2.5% ( MANH1J/MANH=0.975) to 10% (L45J/MANH=0.9).

In addition to considering the isotropic case referenced above, we have employed an actual connection list (for an 8-plane-pair module) of about 5000 connections. For this particular connection list we find:

$$MANH/EUCL = 1.241 \qquad (6)$$

$$L45/EUCL = 1.050 \qquad (7)$$

$$L45J/EUCL = -1.129 \qquad (8)$$

$$L45/MANH = 0.846 \qquad (9)$$

$$L45J/MANH = 0.910 \qquad (10)$$

The small differences between this case and the isotropic case reflect deviations from perfect isotropy of connections, but nevertheless the wire length savings is apparent.

In addition to calculating improvement for all wire lengths, we have also considered the wire length savings for the longest wire lengths of the module. For the same 5000 connection list we considered only those 70 wires (out of 5000) which have a minimum-Manhattan length greater than one module side. For these 70 wires we calculate:

$$MANH/EUCL = 1.340 \quad (11)$$

$$L45/EUCL = 1.061 \quad (12)$$

$$L45J/EUCL = 1.177 \quad (13)$$

$$L45/MANH = 0.792 \quad (14)$$

$$L45J/MANH = 0.878 \quad (15)$$

Thus for these particular 70 wires we find a 12% length reduction (L45J/MANH=0.878) in employing the invention as opposed to the average wire length reduction (L45J/MANH=0.9. This result is not surprising since the longest wires tend to lie closer to the diagonal axes.

The improvement ratios identified above (ratios 4, 5, 9, 10, 14 and 15) were achieved without requiring any change in wire width W and minimum wiring spacing S or the grid spacing of connection sites. This is achieved by choosing the jog segments of each of the oblique running wires to lie at 0° and 90° to the theoretical orthogonal lines at the intersections of which the connection sites lie. For example, the segment SX is perpendicular to the theoretical line OV2 and the segment SY is perpendicular to the line OH2, etc. The distance of closest approach between a wire segment and a connection site is therefore the same as in the usual X-Y wiring case. If the grid spacing is even slightly larger than minimum, additional performance and wire length improvements are realized by running the jog segments at angles closer to 45°. In a limit at which no jogs are required, a 17% reduction below minimum Manhattan length would result (ratio 4).

The minimum spacing between adjacent diagonal wire segments within a plane must be consistent with fabrication tolerances in order to avoid creating electrical shorts. In units of the grid spacing (of FIG. 6), the minimum interwire spacing is 0.414−W. For a 16 mil grid spacing under "worst case" assumption, this means that W+S=6.63 mils. As a result we can select W=3.3 mils and S=3.3 mils.

There are two reasons which contribute to the reduction in the number of required wiring planes.

One of the effects is the fact that a wiring arrangement in accordance with the present invention uses a smaller total wiring length and hence the number of wiring planes can be reduced below that required in for example X-Y orthogonal wiring practice. The total connection length (ignoring jogs) is reduced by approximately 17% when four different principal wiring directions (x, y, 45°, 135°) are used in accordance with the present invention, as compared with minimum manhattan length. This total connection length, ignoring jogs, determines how much of the wiring tracks is occupied by wire, and leads to an approximately 17% reduction in the required number of wiring planes. The second effect which reduces the necessary number of wiring planes is the fact that diagonal or oblique wiring provides for a wire track capacity (between adjacent connection sites C) which is 1.414 times that for wiring planes whose principal wiring direction is along the Cartesian coordinate axes. In other words, if all wiring tracks were fully packed with wire, the wiring plane whose principal wiring direction was parallel to one of the Cartesian coordinate axes of a module of side length M would carry a length of wire equal to $M^2$, where the spacing between adjacent wiring tracks is one unit of length. On the other hand, an oblique plane (with the principal wiring direction at 45° to the Cartesian coordinate axes) would carry 1.414 $M^2$ length of wire (ignoring the wire length required by jogs or meanders).

Although the various wiring planes have been described as having a principal wiring direction, hat is not to be construed as a requirement that all the wiring on any plane be parallel. Indeed, depending on other constraints (such as electrical and fabrication issues) there may be "wrong way" wiring which is along an axis not parallel to the principal wiring direction. The principal wiring direction rather is defined by that direction which is parallel to the majority of the conductive lines. In addition, while the 45° angle for the oblique wiring planes (relative to our Cartesian coordinate system) is preferred, it should be apparent to those skilled in the art that oblique angles other than 45° are possible. These and other variations, which will occur to those skilled in the art after reviewing this specification, are comprehended within the present invention, which is not to be limited by this specific description in this application and instead is to be construed in accordance with the claims attached hereto.

Having thus described my invention, what I claim as new, and desire to secure by Letters Patent is:

1. A wiring arrangement for connecting a plurality of electrical or electronic devices which are supported adjacent said wiring arrangement comprising:
    a plurality of sets of wiring planes, each of said wiring planes supporting conductive wiring oriented in a principal wiring direction and further supporting a plurality of connection sites arranged at intersections of theoretical orthogonal lines,
    connections between said connection sites being implemented by said wiring arrangement employing wiring planes exclusively within a single set of said wiring planes,
    each of said sets of wiring planes including at least first and second wiring planes, a principal direction of wiring on a first wiring plane in a set lying at an acute angle to a principal direction of wiring on a second wiring plane of said set,
    a principal direction of wiring on one of said first wiring planes lying orthogonal or parallel to a principal wiring direction of others of said first wiring planes,
    a principal direction of wiring on one of said second wiring planes lying orthogonol or parallel to a principal wiring direction of others of said second wiring planes.

2. A wiring arrangement as recited in claim 1 in which each said set of wiring planes includes a pair of wiring planes and said acute angle is about 45°.

3. A wiring arrangement as recited in claim 1 wherein said wiring on either said first or second wiring planes departs from a principal wiring direction associated with said plane to meander around said connection sites.

4. A wiring arrangement as recited in claim 3 in which said departure of said wiring from said principal wiring direction traverses said theoretical lines at right angles.

5. A wiring arrangement as recited in claim 1 wherein said wiring comprises a conductor printed on a substrate of said wiring plane.

6. A wiring arrangement as recited in claim 1 wherein said sets of wiring planes are separated by reference planes.

7. A wiring arrangement as recited in claim 1 wherein said wiring planes have ceramic substrates.

8. A wiring arrangement for connecting a plurality of electrical or electronic devices which are supported adjacent a substantially common plane comprising:
a plurality of sets of wiring planes, each of said wiring planes supporting conductive wiring oriented in a principal wiring direction and further supporting a plurality of connection sites arranged at intersections of theoretical orthogonal lines,
connections between said connection sites being implemented by said wiring arrangement employing only wiring planes within a single set of said wiring planes,
each of said sets of wiring planes including at least first and second wiring planes, a principal direction of wiring on a first wiring plane in a set lying at an acute angle to a principal direction of wiring on a second wiring plane of said set,
principal directions selected so that for every set there is another, non-identical set, with a common principal wiring direction.

9. A wiring arrangement as recited in claim 8 wherein there are n+1 sets of wiring planes, where n is an integer greater than unity, each set including only a pair of wiring planes with principal wiring directions for said wiring plane pairs, expressed relative to an abscissa of a Cartesian coordinate system of 0°, z°; z°, 2z°; 2z°, 3z°; . . . nz°, 180°, where z is given as (180/n+1).

10. A wiring arrangement as recited in claim 8 wherein said wiring on either said first or second wiring planes departs from a principal wiring direction associated with said plane to meander around said connection sites.

11. A wiring arrangement as recited in claim 10 in which said departure of said wiring from said principal wiring direction traverses said theoretical lines at right angles.

12. A wiring arrangement as recited in claim 8 wherein said wiring comprises a conductor printed on a substrate of said wiring plane.

13. A wiring arrangement as recited in claim 8 wherein said sets of wiring planes are separated by reference planes.

14. A wiring arrangement as recited in claim 8 wherein said wiring planes have ceramic substrates.

* * * * *

UNITED STATES PATENT AND TRADEMARK OFFICE
CERTIFICATE OF CORRECTION

PATENT NO. : 4,782,193
DATED : November 1, 1988
INVENTOR(S) : Ralph Linsker

It is certified that error appears in the above-identified patent and that said Letters Patent is hereby corrected as shown below:

Col. 1, line 36, "has" should be --have--;

line 41, after "deformed" insert --,--;

line 60, "diclosed" should be --disclosed--.

Col. 2, line 12, ".iwring" should be --wiring--;

line 25, after "seq." insert --,--.

Col. 8, line 1, "plaes" should be --planes--;

line 8, "prinipal" should be --principal--.

Col. 10, Equation 8, "L45J/EUCL = -1.129" should be --L45J/EUCL = 1.129--.

Col. 11, lines 63-64, "manhattan" should be --Manhattan--.

Col. 12, line 16, "hat" should be --that--.

Signed and Sealed this

Eighteenth Day of April, 1989

*Attest:*

DONALD J. QUIGG

*Attesting Officer*      *Commissioner of Patents and Trademarks*